(12) United States Patent
Ganz et al.

(10) Patent No.: US 9,812,336 B2
(45) Date of Patent: Nov. 7, 2017

(54) FINFET SEMICONDUCTOR STRUCTURES AND METHODS OF FABRICATING SAME

(71) Applicant: GLOBALFOUNDRIES Inc., Grand Cayman (KY)

(72) Inventors: Michael Ganz, Clifton Park, NY (US); Bingwu Liu, Ballston Spa, NY (US); Johannes Marinus Van Meer, Delmar, NY (US); Sruthi Muralidharan, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 99 days.

(21) Appl. No.: 14/519,215

(22) Filed: Oct. 21, 2014

(65) Prior Publication Data

US 2015/0115371 A1    Apr. 30, 2015

Related U.S. Application Data

(60) Provisional application No. 61/896,989, filed on Oct. 29, 2013.

(51) Int. Cl.
*H01L 21/02* (2006.01)
*H01L 21/266* (2006.01)
(Continued)

(52) U.S. Cl.
CPC .......... *H01L 21/324* (2013.01); *H01L 21/265* (2013.01); *H01L 21/266* (2013.01);
(Continued)

(58) Field of Classification Search
CPC .............. H01L 21/0217; H01L 21/0228; H01L 21/324; H01L 21/31055; H01L 21/823431;
(Continued)

(56) References Cited

U.S. PATENT DOCUMENTS 6,287,913 B1 * 9/2001 Agnello .......... H01L 21/823443
                                              257/E21.622
6,518,151 B1 * 2/2003 Dobuzinsky ...... H01L 21/32139
                                              257/E21.314
(Continued)

*Primary Examiner* — Maliheh Malek
(74) *Attorney, Agent, or Firm* — Heslin Rothenberg Farley & Mesiti P.C.

(57) ABSTRACT

The invention provides a method of forming a semiconductor structure, which include: providing an intermediate semiconductor structure having semiconductor substrate, a fin having an EG oxide layer in contact with at least a portion of the fin, and a gate stack disposed over a portion of the fin; forming a silicon nitride layer over portions of the fin that are not located under the gate stack; and after forming the silicon nitride layer, performing one or more ion implantation steps on the intermediate semiconductor structure. The invention also provides a method of forming a semiconductor structure including: providing an intermediate semiconductor structure having a semiconductor substrate, a fin having an EG oxide layer in contact with at least a portion of the fin, and a gate material disposed over the fin; forming, over the fin and gate material of the intermediate semiconductor structure, a gate stack hardmask including an oxide layer; forming a silicon nitride barrier layer on the oxide layer of the gate stack hardmask; performing one or more gate stack hardmask patterning steps; removing the EG oxide layer from portions of the fin that are not located under the gate; and subsequent to removing the EG oxide layer from portions of the fin that are not located under the gate, performing one or more ion implantation steps.

3 Claims, 19 Drawing Sheets

(51) Int. Cl.
    *H01L 29/78*     (2006.01)
    *H01L 21/324*     (2006.01)
    *H01L 29/66*     (2006.01)
    *H01L 21/265*     (2006.01)
    *H01L 21/3213*     (2006.01)
    *H01L 21/268*     (2006.01)

(52) U.S. Cl.
    CPC .... H01L 29/66803 (2013.01); H01L 29/7854 (2013.01); *H01L 21/268* (2013.01); *H01L 21/32139* (2013.01)

(58) Field of Classification Search
    CPC ........... H01L 21/823821; H01L 21/845; H01L 29/785; H01L 29/7851; H01L 29/7855–29/7856; H01L 29/66795; H01L 29/66803
    See application file for complete search history.

(56) References Cited

U.S. PATENT DOCUMENTS

| | | | | |
|---|---|---|---|---|
| 8,536,029 B1* | 9/2013 | Chang | | H01L 21/845 257/29 |
| 9,082,698 B1* | 7/2015 | Joshi | | H01L 21/265 |
| 9,276,115 B2* | 3/2016 | Leobandung | | H01L 21/28008 |
| 9,305,845 B2* | 4/2016 | Colburn | | H01L 21/823431 |
| 2005/0239242 A1* | 10/2005 | Zhu | | H01L 21/845 438/199 |
| 2006/0245245 A1* | 11/2006 | Mokhlesi | | H01L 27/115 365/185.01 |
| 2007/0004117 A1* | 1/2007 | Yagishita | | H01L 21/845 438/197 |
| 2009/0212351 A1* | 8/2009 | Chen | | B82Y 10/00 257/324 |
| 2013/0034948 A1* | 2/2013 | Huang | | H01L 21/3081 438/424 |
| 2013/0105897 A1* | 5/2013 | Bangsaruntip | | B82Y 10/00 257/351 |
| 2013/0230953 A1* | 9/2013 | Sudo | | H01L 29/785 438/268 |
| 2013/0230965 A1* | 9/2013 | Sudo | | H01L 21/0337 438/404 |
| 2013/0277720 A1* | 10/2013 | Kim | | H01L 29/785 257/288 |
| 2014/0011341 A1* | 1/2014 | Maszara | | H01L 29/66795 438/478 |
| 2014/0024198 A1* | 1/2014 | Haran | | H01L 21/76283 438/404 |
| 2014/0065782 A1* | 3/2014 | Lu | | H01L 29/785 438/294 |
| 2014/0162447 A1* | 6/2014 | Edge | | H01L 29/66795 438/586 |
| 2015/0021695 A1* | 1/2015 | Hu | | H01L 29/785 257/368 |
| 2015/0041905 A1* | 2/2015 | Xie | | H01L 29/6656 257/369 |
| 2015/0091100 A1* | 4/2015 | Xie | | H01L 21/76224 257/401 |
| 2015/0115371 A1* | 4/2015 | Ganz | | H01L 21/266 257/401 |
| 2015/0162434 A1* | 6/2015 | Loubet | | H01L 29/785 257/347 |
| 2015/0171096 A1* | 6/2015 | Zhu | | H01L 29/788 257/192 |
| 2015/0340501 A1* | 11/2015 | Wu | | H01L 29/7849 257/365 |
| 2015/0364378 A1* | 12/2015 | Xie | | H01L 21/823437 257/368 |
| 2015/0380404 A1* | 12/2015 | Zang | | H01L 27/0886 257/401 |
| 2016/0079124 A1* | 3/2016 | Yin | | H01L 21/823431 438/283 |
| 2016/0293761 A1* | 10/2016 | Liu | | G06N 3/04 |

\* cited by examiner

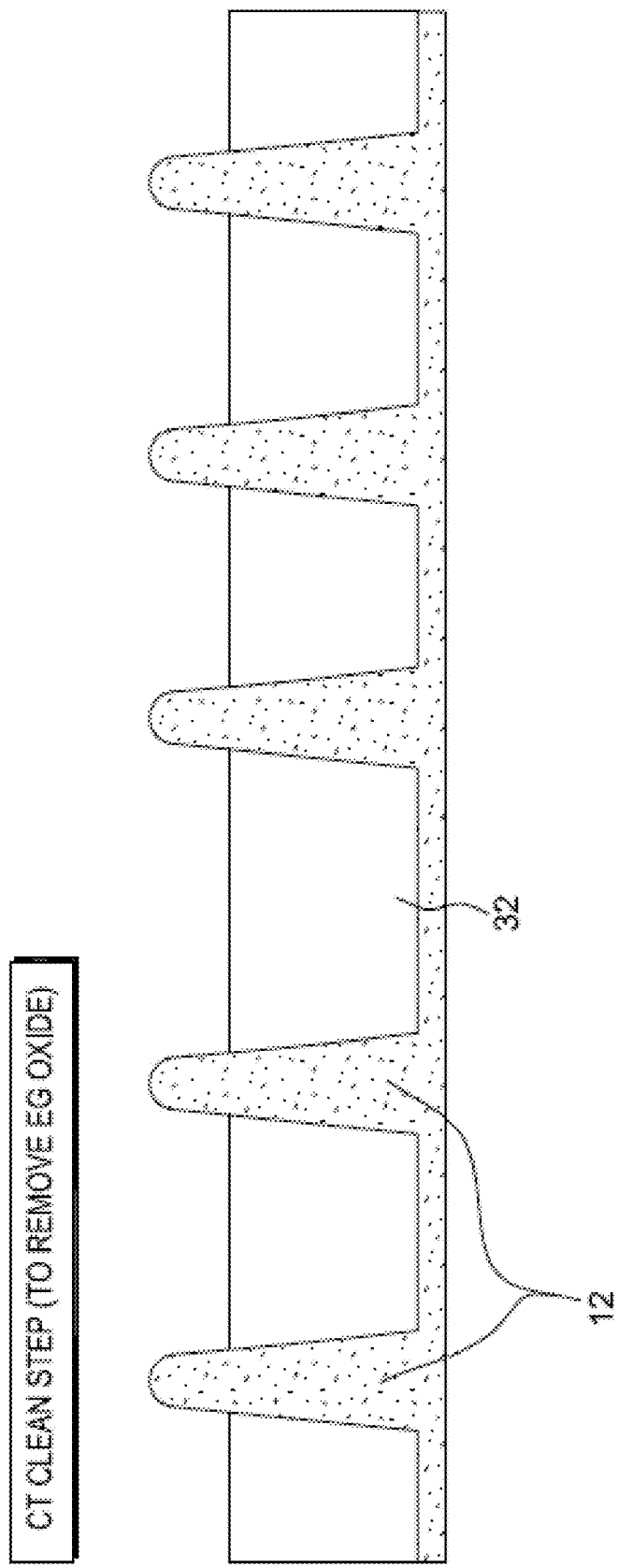

FINFET SEMICONDUCTOR STRUCTURES AND METHODS OF FABRICATING SAME

CROSS REFERENCE TO RELATED APPLICATIONS

This application claims priority to U.S. Provisional Application No. 61/896,989, filed Oct. 29, 2013, which is hereby incorporated herein in its entirety.

FIELD OF THE INVENTION

The present invention generally relates to semiconductor structures and methods of fabricating semiconductor structures, and more particularly, to methods of forming semiconductor structures using a protective silicon nitride layer and optionally including an EG oxide removal for post-PC implantation improvements.

BACKGROUND OF THE INVENTION

In contrast to traditional planar metal-oxide-semiconductor field-effect transistors (MOSFETs), which are fabricated using conventional lithographic fabrication methods, non-planar field-effect transistors (FETs) incorporate various vertical transistor structures, and typically include two or more gate structures formed in parallel. One such semiconductor structure is the "FinFET," which takes its name from the multiple thin "fins" that are used to form the respective gate channels, and which are typically on the order of tens of nanometers in width.

More particularly, referring to the exemplary prior art semiconductor structure shown in FIG. 1, a finFET 10 generally includes two or more parallel silicon fin structures (or simply "fins") 12. The fins are typically formed on a semiconductor substrate 14 (FIG. 2) with the fin structures extending between a common drain electrode and a common source electrode (not shown). A conductive gate structure 16 "wraps around" three sides of fins 12, and is separated from the fins by a standard gate oxide layer 18. Fins 12 may be suitably doped to produce the desired FET polarity, as is known in the art, such that a gate channel is formed within the near surface of the fins adjacent to gate oxide 18.

FIG. 2 illustrates, in cross-section, a conventional semiconductor substrate 14 including a support substrate 20, a silicon oxide layer 22, and a silicon-comprising material layer 24 overlying the silicon oxide layer. The silicon-comprising material from which the fin structures are formed and the silicon oxide layer form a silicon on insulator (SOI) structure 26 that, in turn, is supported by the support substrate 20. Fins may be formed using any conventional process, including but not limited to, conventional photolithographic and anisotropic etching processes (e.g. reactive ion etching (RIE) or the like). After formation and cleaning of the fins, FinFET processing steps may include forming the gate structure(s) 16, ion implantation, and source/drain (S/D) epitaxy modules.

Unfortunately, semiconductor structure processing steps performed subsequent to fin formation can create defects in the fins, and/or can cause portions of the fins to become eroded. These defects and eroded fins can compromise the performance of semiconductor devices in which they are ultimately used.

Thus, a need exists for improved semiconductor structures and methods of making the same, which allow for the integrity of the fin structures to be better preserved during semiconductor fabrication. Other desirable features and characteristics of the present invention will become apparent from the following detailed description of the invention and the appended claims, taken in conjunction with the accompanying drawings and this background of the invention.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

In this specification, where an act or item of knowledge is referred to or discussed, this reference or discussion is not an admission that the act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved semiconductor structures and methods of making the same, which allow for, e.g., the integrity of fin structures to be better preserved during semiconductor fabrication. The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In one aspect, the invention provides a method of forming a semiconductor structure. The method includes:
  providing an intermediate semiconductor structure which includes:
    a semiconductor substrate;
    a fin having an extended gate (EG) oxide layer in contact with at least a portion of the fin; and
    a gate stack disposed over a portion of the fin;
  forming a silicon nitride layer over portions of the fin that are not located under the gate stack; and
  after forming the silicon nitride layer, performing one or more ion implantation steps on the intermediate semiconductor structure.

In another aspect, the invention provides a method of forming a semiconductor structure which includes:
  providing an intermediate semiconductor structure, which includes:
    a semiconductor substrate;
    a fin having an EG oxide layer in contact with at least a portion of the fin; and
    a gate material disposed over the fin;
  forming, over the fin and gate material of the intermediate semiconductor structure, a gate stack hardmask which includes an oxide layer;
  forming a silicon nitride barrier layer on the oxide layer of the gate stack hardmask;
  performing one or more gate stack hardmask patterning steps;
  removing the EG oxide layer from portions of the fin that are not located under the gate; and
  after removing the EG oxide layer from portions of the fin that are not located under the gate, performing one or more ion implantation steps.

Certain embodiments of the presently-disclosed semiconductor structures and methods of forming semiconductor structures have several features, no single one of which is solely responsible for their desirable attributes. Without limiting the scope of these semiconductor structures and methods of forming semiconductor structures as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing semiconductor structures and methods of forming the same which may allow for improved fin integrity following semiconductor processing, and/or enabling a lower energy implant scheme.

These and other features and advantages of this invention will become apparent from the following detailed description of the various aspects of the invention taken in conjunction with the appended claims and the accompanying drawings.

BRIEF DESCRIPTION OF THE DRAWINGS

The present invention will hereinafter be described in conjunction with the following drawing figures, wherein like numerals denote like elements, and:

FIG. 17 shows a representation of an intermediate semiconductor structure during processing according to embodiments of the inventive method.

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not necessarily drawn to scale for ease of understanding, wherein the same reference numbers used throughout different figures designate the same or similar components.

Figure 1:
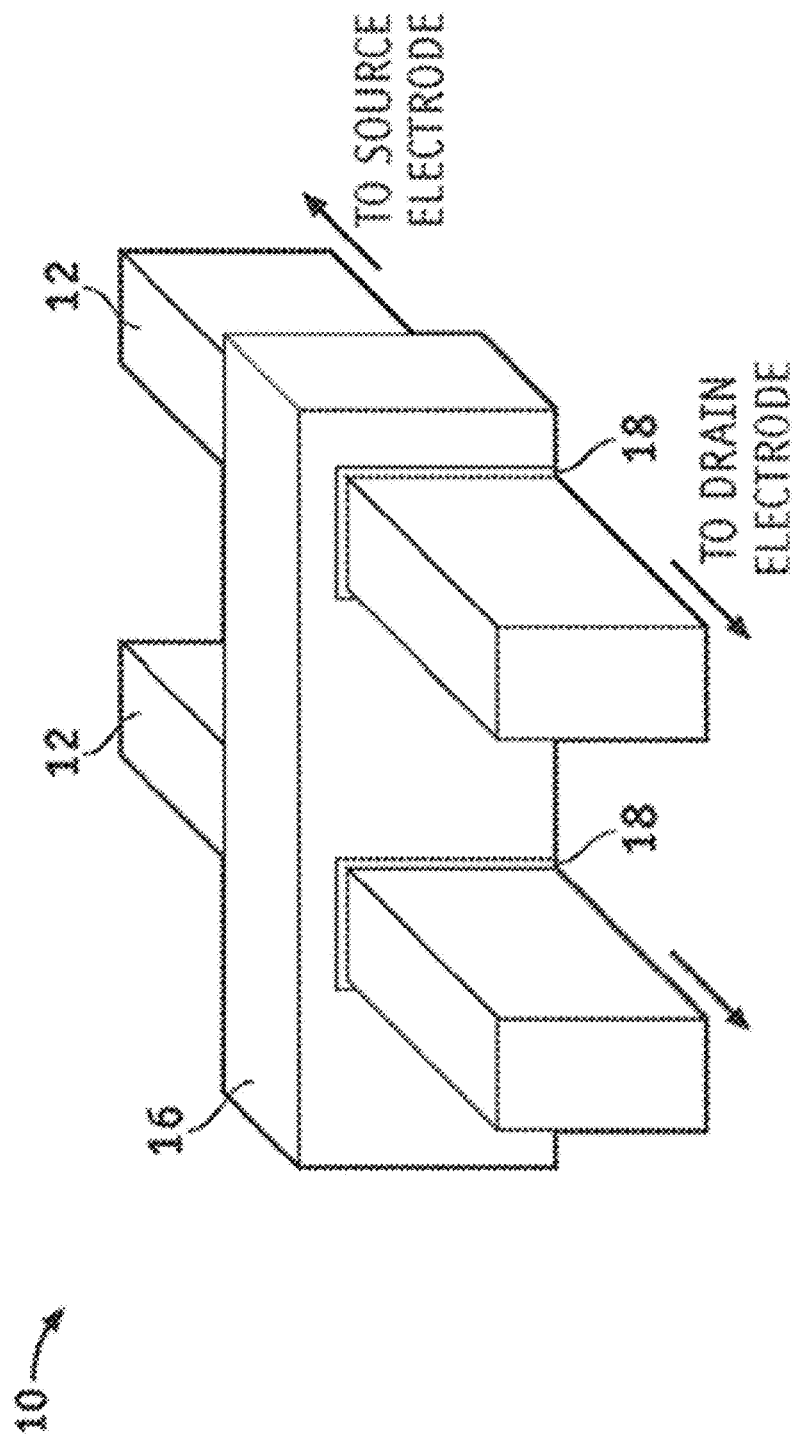
FIG. 1 is an isometric schematic view of a FinFET structure available in the prior art.
Figure 2:
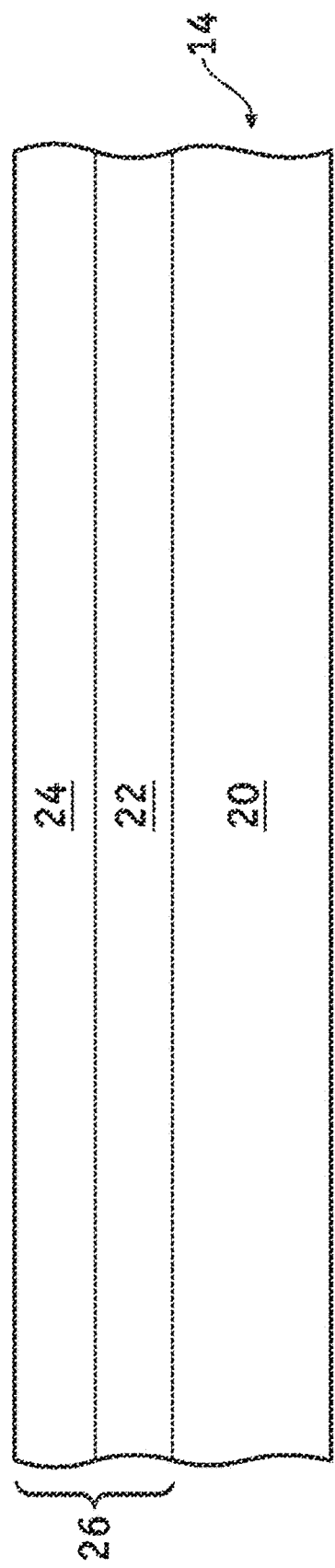
FIG. 2 illustrates, in cross section, a portion of a conventional semiconductor substrate available in the prior art including a silicon substrate, a silicon oxide layer overlying the silicon substrate, and a silicon-comprising material layer overlying the silicon oxide layer.
Figure 3A:
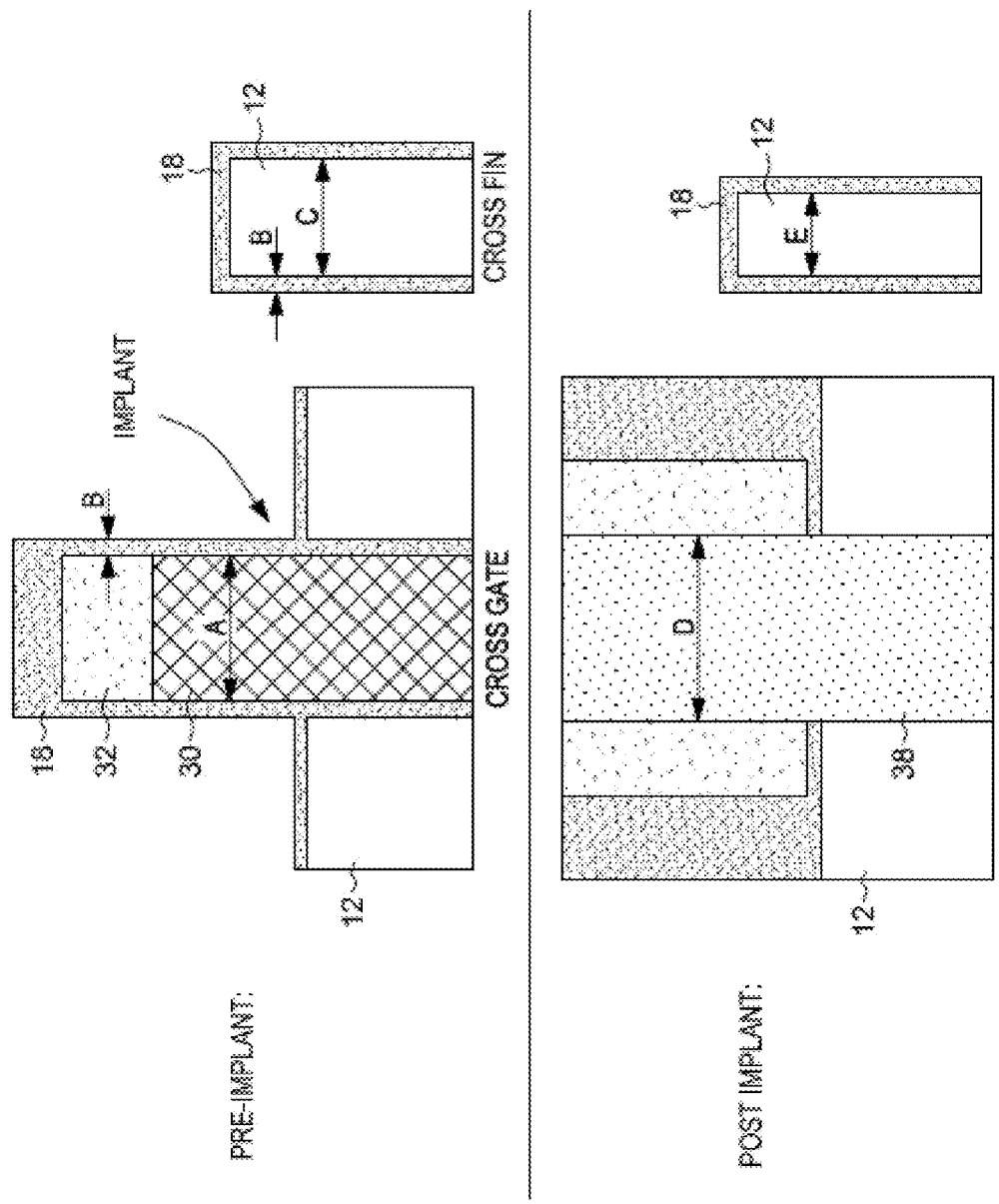
FIG. 3A depicts cross-sections of portions of a conventional semiconductor structure.

FIG. 3A depicts cross-sections of portions of a conventional semiconductor structure. During implantation, the silicon fin 12 is amorphized, and during photoresist (PR) strip following implantation, fin material is lost which causes the fin critical dimension (CD) to thin down (E<C), external resistance (Rext) to increase and, consequently, device performance degradation. Further, the CD of poly gate 30 (A) (depicted in the upper left of FIG. 3A under NiT gate hardmask 30), that receives implant is smaller than the final HK/MG metal gate 38 CD (D), D>A+2*B, where B is the thickness of the $SiO_2$ EG oxide layer 18. The present invention provides semiconductor structures and methods of making the same that address these and other problems and deficiencies.

Figure 3B:
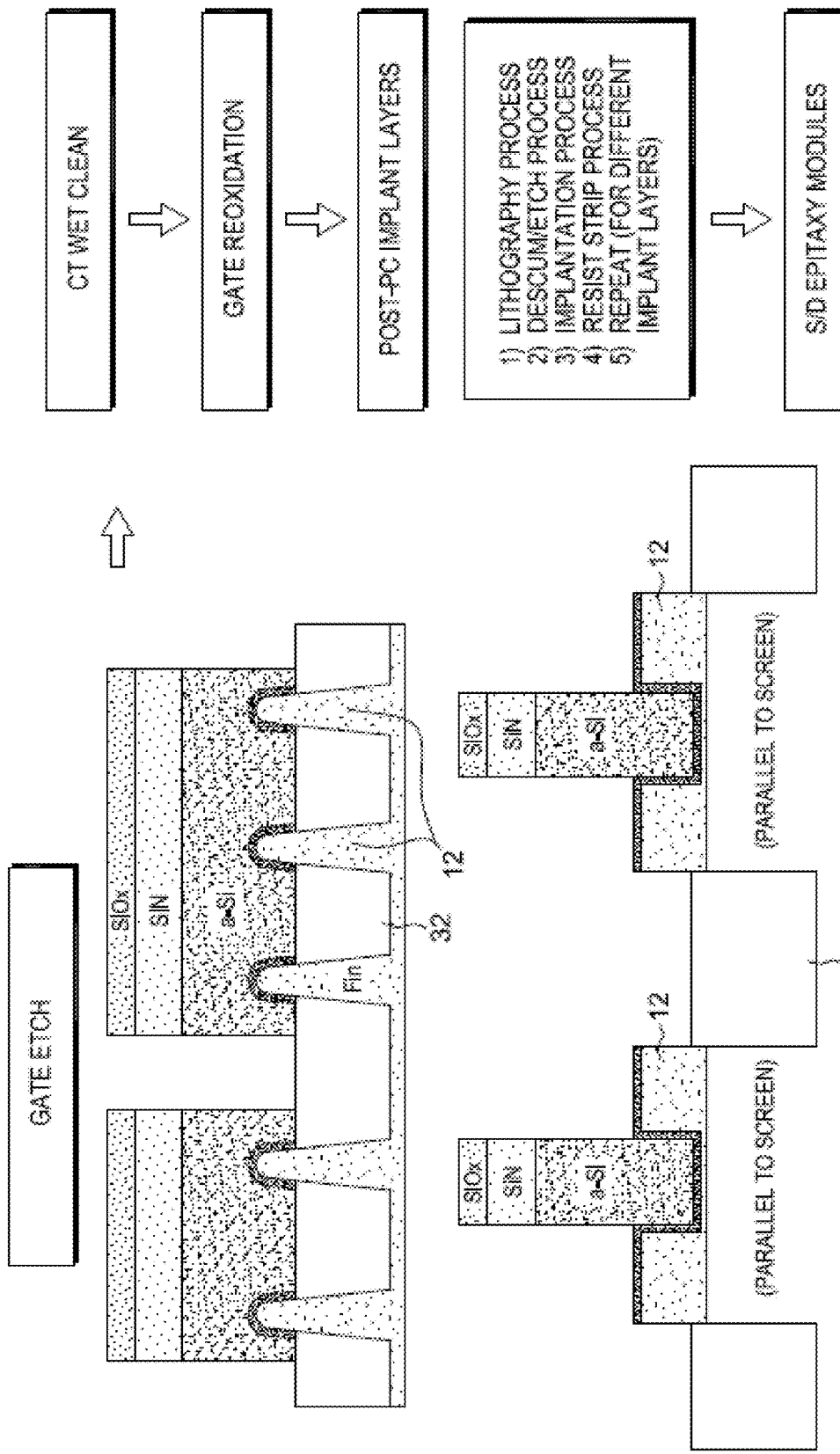
FIG. 3B depicts process steps that make up part of a conventional method of forming a semiconductor structure.

FIG. 3B shows steps that make up part of a conventional method of forming a semiconductor structure including fins 12. Also depicted are shallow trench isolation (STI) regions 32. The top illustration shows fins perpendicular to the screen, whereas the bottom illustration shows fins parallel to the screen.

Generally stated, disclosed herein are improved semiconductor structures, including improved finFET structures, and methods of making the same.

Figure 4:
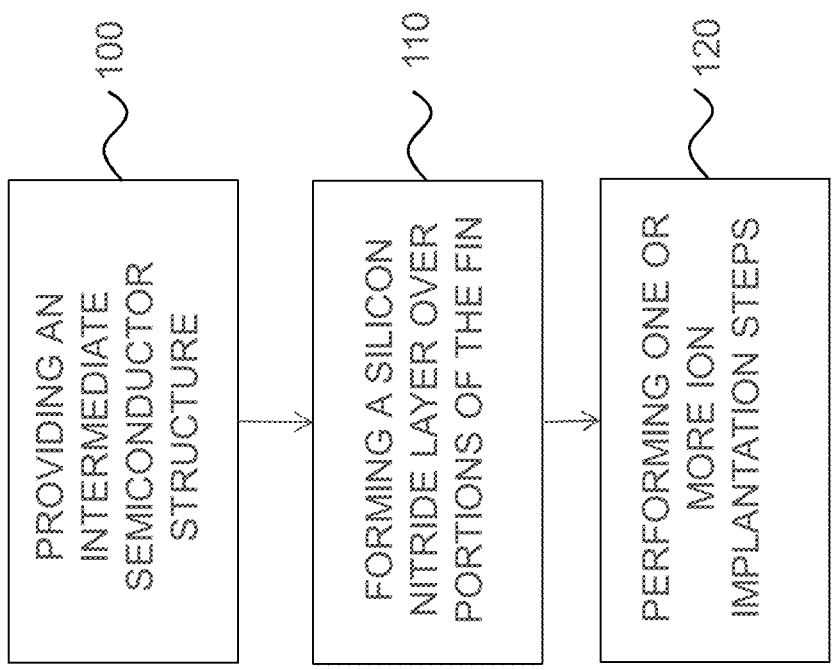
FIG. 4 depicts a method of forming a semiconductor structure according to one embodiment of at least one aspect of the present invention.

FIG. 4 depicts a method of forming a semiconductor structure according to one aspect of the present invention. Referring to FIG. 4, the process includes (in one embodiment): providing an intermediate semiconductor structure having a fin with an EG oxide layer on at least portions of it, and a gate stack disposed over a portion of the fin 100;

forming a silicon nitride layer over portions of the fin that are not located under the gate stack 110; and, after forming the silicon nitride layer, performing one or more ion implantation steps on the intermediate semiconductor structure 120.

In various embodiments, the silicon nitride layer is formed over, e.g., in direct contact with, the EG oxide layer of one or more fins. In some embodiments, the silicon nitride layer is formed using atomic layer deposition (ALD).

In some embodiments, the inventive methods include, in addition to use of a pre-implant silicon nitride protective layer, any additional desired semiconductor fabrication steps. For example, such additional steps may include one or more of POR processing, recrystallization of, e.g., amorphous portions of the fin(s), and forming an epitaxial layer on at least a portion of the fin.

Figure 5:
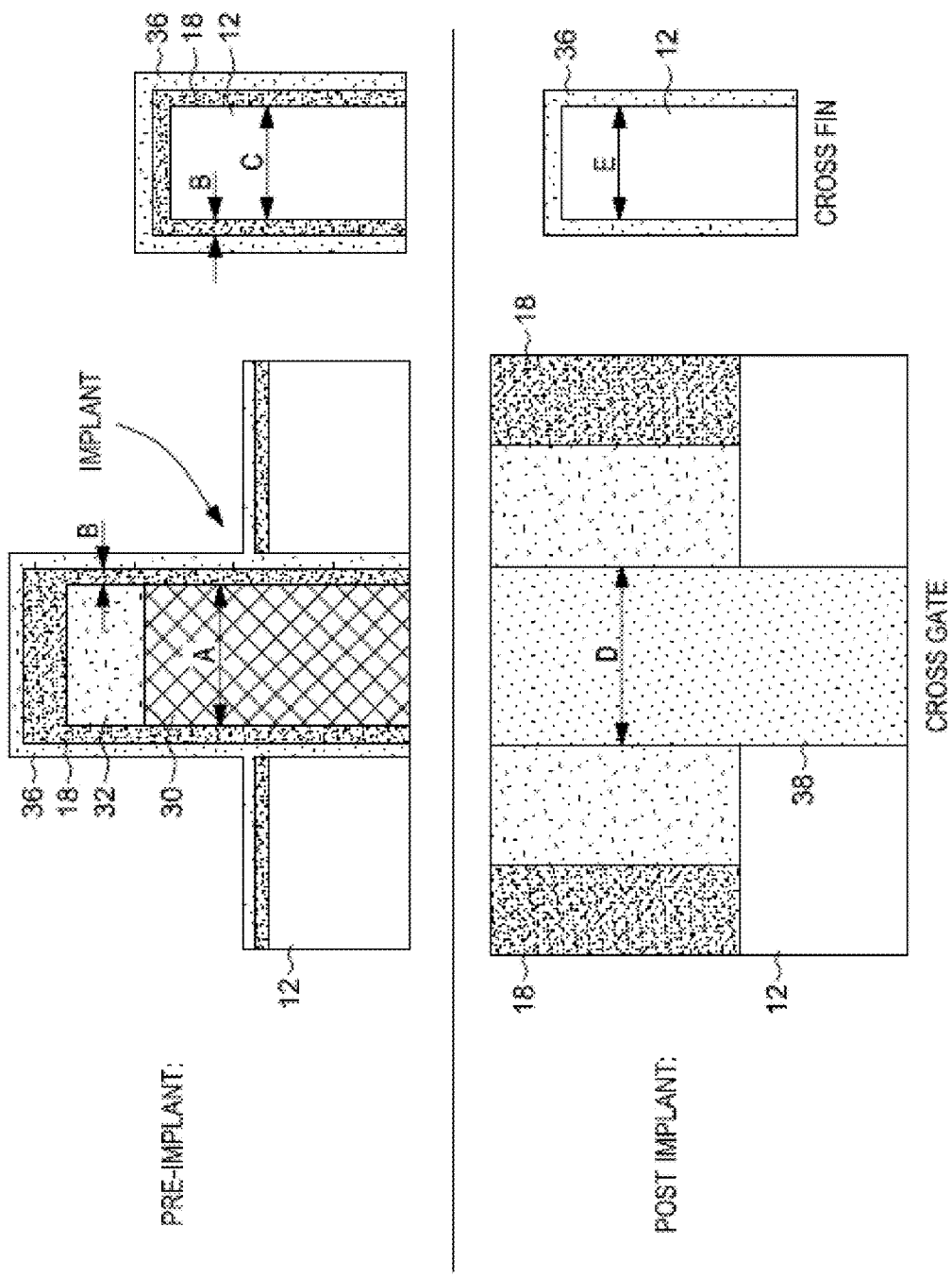
FIG. 5 illustrates cross-sections of portions of a semiconductor structure being fabricated according to one embodiment of the present invention.

FIG. 5 illustrates cross-sections of portions of a semiconductor structure, pre- and post-implant, being fabricated according to one embodiment of the present invention. As shown, prior to implantation, portions of the fin 12 are coated with a thick oxide layer (which is referred to herein as an "EG oxide layer") 18, which, in the embodiment of FIG. 5, is a $SiO_2$ layer. A silicon nitride (SiN) layer 36 is formed over at least a portion of the EG oxide layer 18. In some embodiments, the silicon nitride layer 36 may be, for example, 0.5 nm to 4 nm thick, for example, 0.5, 1.0, 1.5, 2.0, 2.5, 3.0, 3.5, or 4.0 nm thick, including any and all ranges and subranges therein (e.g., 1 to 3 nm). In the depicted embodiment, the silicon nitride layer 36 is about 2.0 nm thick. In some embodiments, the silicon nitride layer 36 is formed after a re-oxidation step.

Following formation of the silicon nitride layer 36, one or more ion implantation steps are performed on the intermediate semiconductor structure. In some embodiments, the one or more ion implantation steps include a post-implant anneal.

In some embodiments of the invention, one or more PR strip steps may follow or form a part of the one or more ion implantation steps.

In certain embodiments of the invention, subsequent to the one or more ion implantation steps, the silicon nitride layer 36 is removed. Since the silicon nitride layer 36 becomes oxidized throughout the post-PC block layer implantation process, this oxidized film can be removed before entering the S/D epitaxy modules. In some embodiments, this helps to remove the oxide on the sidewalls of the of the polysilicon gate, which prevents PC blowout that would occur in the RMG module (an issue that was seen in planar 20 nm technology).

In some embodiments, the silicon nitride layer 36 is removed after one or more post-implant anneal steps.

In some embodiments, the inventive methods include removing the silicon nitride layer 36 with a wet and/or dry etch. For example, wet and dry etches (e.g., treatment with hydrofluoric (HF) acid or Siconi treatment) may be used to remove portions of the silicon nitride layer 36 that become oxidized during semiconductor fabrication steps following the silicon nitride layer formation. In certain embodiments (for example, where a particularly thick silicon nitride layer 36 is used), the step(s) of removing the silicon nitride layer 36 may include one or more treatments to remove one or more un-oxidized portions of the silicon nitride layer 36 (e.g., treatments using phosphoric acid). Thus, in certain embodiments, removing the silicon nitride layer 36 includes one or more of a wet or dry etch, together with a treatment to remove un-oxidized portions of the silicon nitride layer 36.

The silicon nitride layer 36 used in the invention serves to, e.g., protect the fin from amorphization during implant processing. As shown in FIG. 5, where the bottom portion of the figure represents a semiconductor structure post-implant, the final fin CD (E) is equal to or close to the pre-implant fin CD (C). Similarly, the final gate CD (D) is equal or close to the pre-implant gate CD (A).

Figure 6:
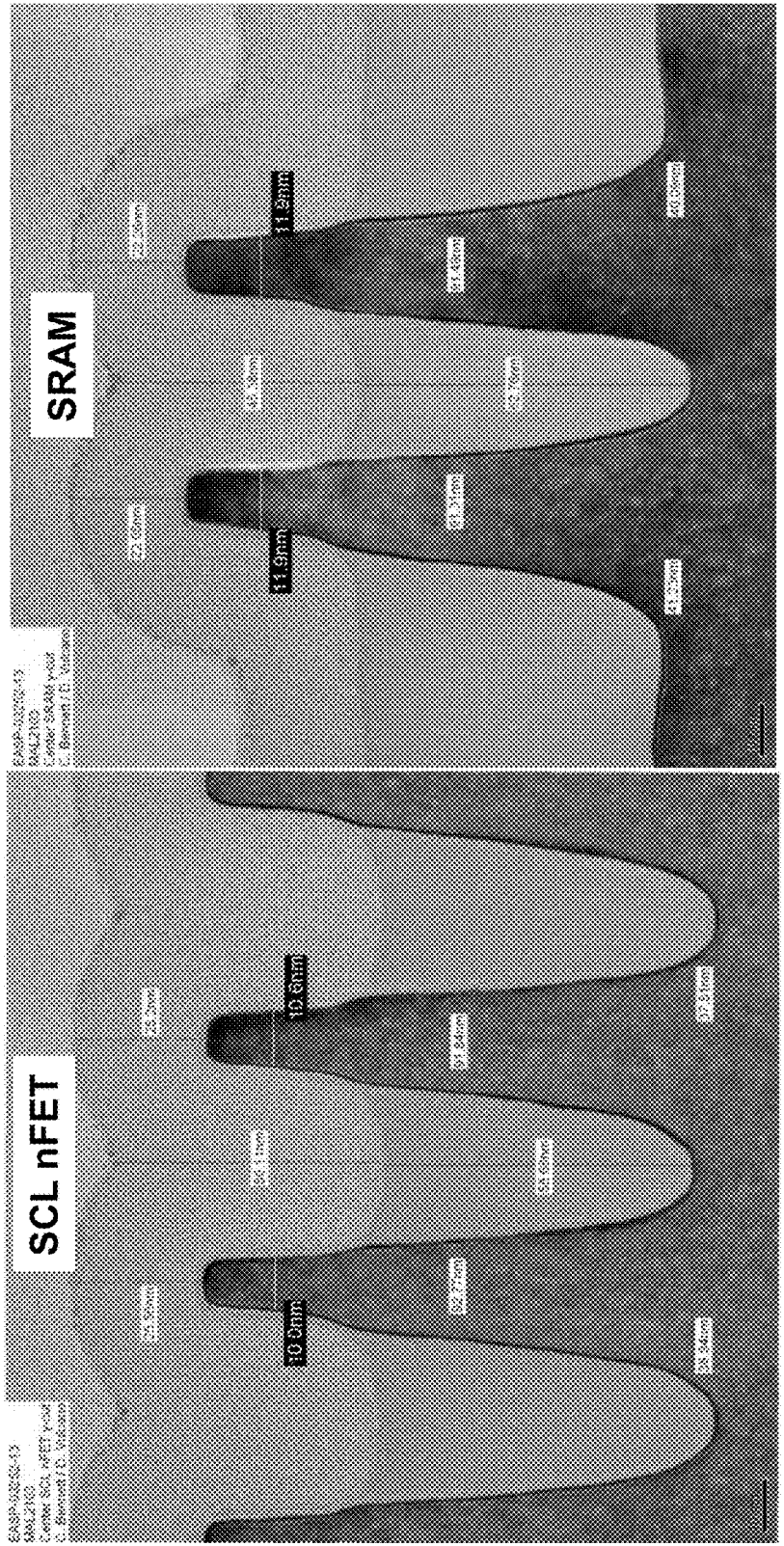
FIG. 6 depicts two transmission electron microscopy (TEM) images showing fins of semiconductor structures pre-implant.

FIG. 6 depicts two transmission electron microscopy (TEM) images showing fins of semiconductor structures pre-implant. As shown, the average fin tip width for the SCL image is 10.3 nm, and the average fin tip width for the SRAM image is 11.9 nm. The fins shown in FIG. 6 have a thin (2-3 nm) coating of EG oxide ($SiO_2$) on them.

Figure 7:
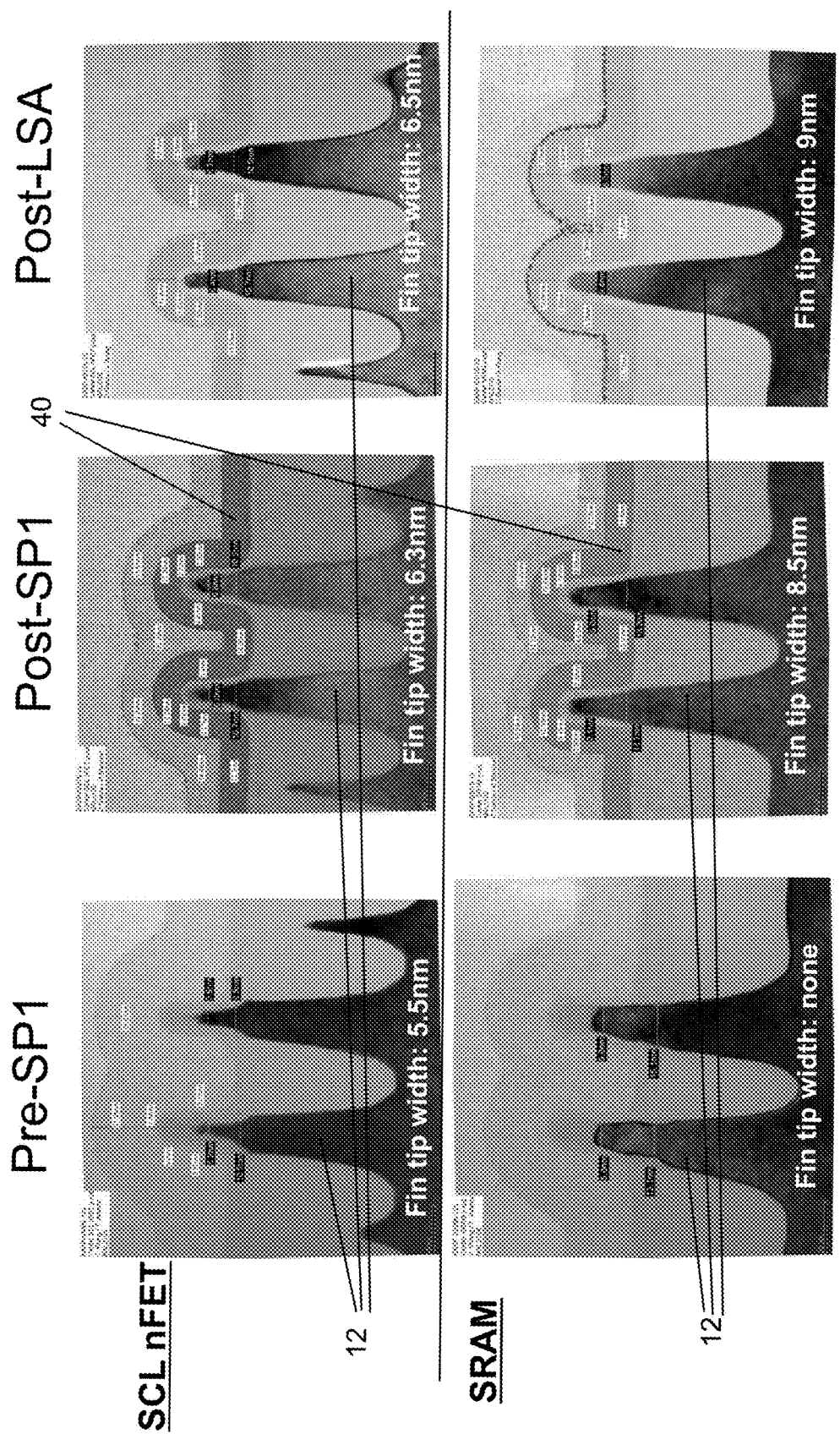
FIG. 7 depicts two sets of TEM images (SCL nFET and SRAM) showing fin semiconductor structures during conventional processing.

FIG. 7 depicts two sets of TEM images (SCL nFET and SRAM) showing fin semiconductor structures during conventional processing, such as that shown in FIG. 3B. The top row (SCL nFET) depicts images during processing performed on the fins 12 shown in the SCL image of FIG. 6, while the bottom row (SRAM) depicts images during processing performed on the fins 12 shown in the SRAM image of FIG. 6. Referring to FIG. 7, the first column ("Pre-SP1") provides TEM images of the fins shown in FIG. 6, after the FIG. 6 fins 12 were subjected to ion implantation and PR strip following the implant. As shown in the Pre-SP1 column, following ion implantation and PR strip, the fins 12 have been considerably compromised. The fin tips are amorphized and have undergone considerable CD loss.

Returning to FIG. 7, the second column ("Post-SP1") provides TEM images of the fins 12 shown in the first column of FIG. 7 after conventional POR processing, which includes formation of the depicted silicon nitride (SiN) spacer layer 40, which is used to protect certain layers from epitaxial growth. Since the POR processing included growth at about 630° C., some recrystallization can be seen in the fins 12 of the second column, as compared to the first column.

Returning to FIG. 7, the third column ("Post-LSA") provides TEM images of the fins 12 shown in the second column of FIG. 7 following laser spike annealing (LSA) to re-crystallize the fins 12.

As can be seen between FIGS. 6 and 7 (see fins 12 after LSA step), conventional semiconductor structure processing for the post-PC block layers, which implant through the EG oxide on the fins 12, causes fin CD loss due to the mix of amorphized silicon and the PR strips.

Figure 8:
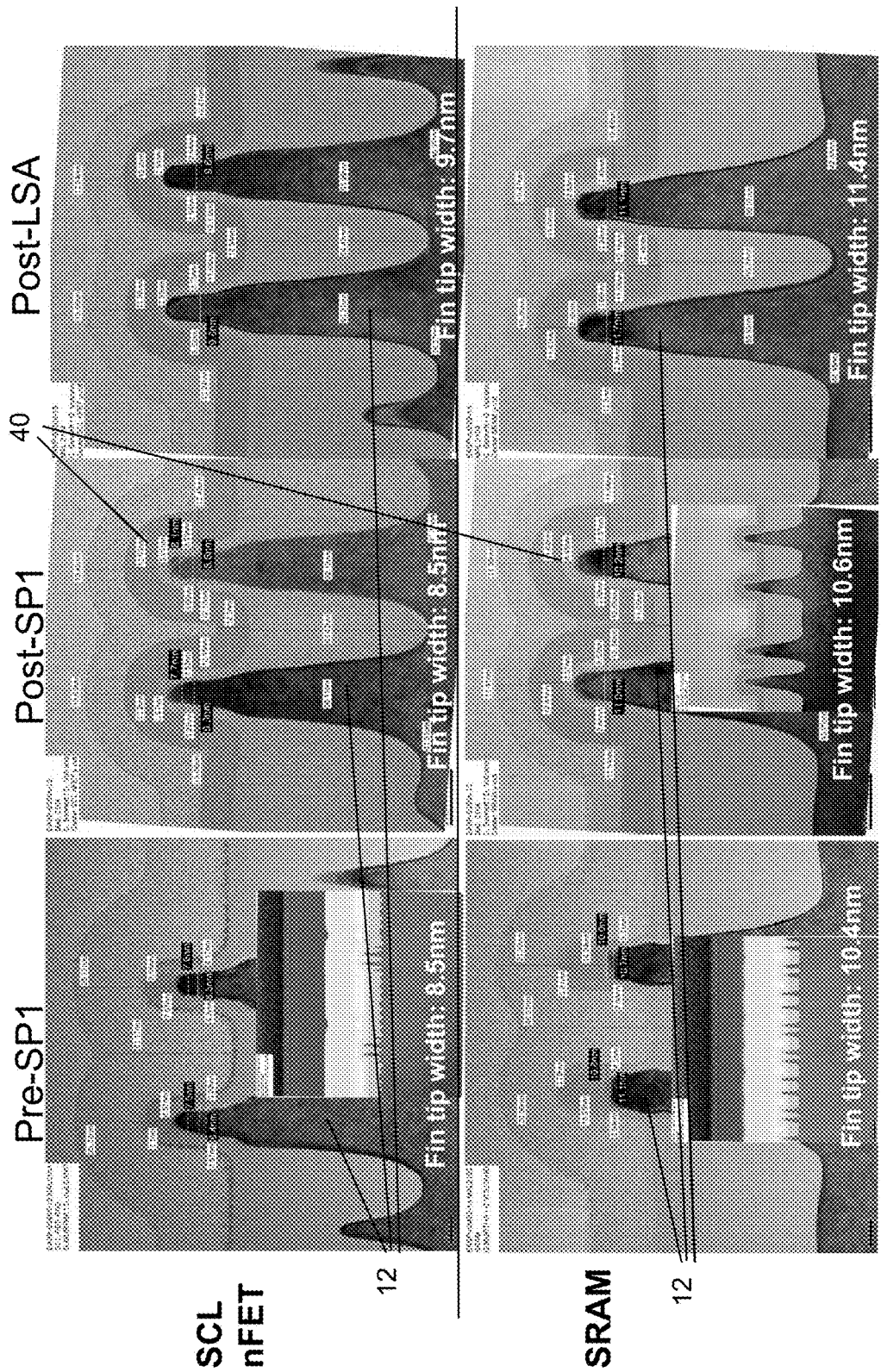
FIG. 8 depicts two sets of TEM images (SCL nFET and SRAM) showing fin semiconductor structures during processing according to an embodiment of the present invention.

FIG. 8 depicts two sets of TEM images (SCL nFET and SRAM) showing fin semiconductor structures during processing according to an embodiment of the present invention. The first column ("Pre-SP1") provides TEM images of the fins 12 shown in FIG. 6, after a ~2 nm thick layer of silicon nitride was deposited over the EG oxide layer of the fins 12 by ALD. Following ALD of the silicon nitride layer, the fins 12 were subjected to ion implantation and PR strip following the implantation. The resultant fins 12, following ion implantation and PR strip, are shown in the Pre-SP1 column. As can be seen, use of the silicon nitride layer prior to implant, in accordance with the present invention, resulted in improved fins following implant and PR strip. The average fin tip width for the SCL nFET decreased from 10.3 nm to 8.5 nm (as compared to a decrease to 5.55 nm in conventional processing without the silicon nitride layer), and the average fin tip width for the SRAM decreased from 11.9 nm to 10.4 nm (as compared to a decrease to 9.4 nm in conventional processing).

As evidenced by the results shown in FIG. 8, certain embodiments of the invention provide an advantage over conventional semiconductor fabrication methods in that, during processing, after implantation and PR strip, there is a fin tip CD loss of less than 25% (e.g., less than 25, 24, 23, 22, 21, 20, 19, 18, 17, 16, 15, 14, 13, 12, 11, 10, 9, 8, 7, 6, 5, 4, 3, 2, or 1%) as compared to the fin tip CD before the one or more ion implantation steps and PR strip, where "fin tip CD loss" may be calculated as:

$$\frac{(\text{Pre-Implant Fin Tip } CD) - (\text{Post-Implant Fin Tip } CD)}{(\text{Pre-Implant Fin Tip } CD)} \times 100$$

By way of example, for the SCL nFET fins 12 shown in FIG. 8, whose width decreased from 10.3 nm to 8.5 nm in the inventive process, the fin tip CD loss would be 17.5%, whereas for the SCL nFET fins shown in FIG. 7, whose width decreased from 10.3 nm to 5.55 nm in conventional processing, the fin tip CD loss would be 46.1%. In conventional processing, fin tip CD loss is typically greater than or equal to 30%. Fin tip CD loss may also be calculated following formation of the spacer (e.g., using the images shown in the Post-SP1 column), and/or following recrystallization (e.g., using the images shown in the Post-LSA column).

Comparison of the fins 12 shown in the semiconductor structures depicted in the first column of FIG. 8, processed according to embodiments of the inventive process utilizing a pre-implant protective silicon nitride layer, with the fins 12 shown in the first column of FIG. 7, processed according to the conventional process without the silicon nitride layer, clearly shows that embodiments of the present inventive method effectively reduce fin CD loss and preserve the integrity of fin structures post-implant. By realizing, inter alia, improved fin erosion during post gate block layers and improved Rext from the ext area, embodiments of the inventive processes and the resultant inventive semiconductor structures are able to reduce capacitance overlap (Cov) to improve the alternating current (AC) and direct current (DC) performance of circuits, and allow for overall improved semiconductor device performance.

Returning to FIG. 8, the second column ("Post-SP1") provides, similar to FIG. 7, TEM images of the fins 12 shown in the first column of FIG. 8 after conventional POR processing, which includes formation of the depicted silicon nitride spacer layer ("SiN spacer") 40, which is used to protect certain layers from epitaxial growth.

Returning to FIG. 8, the third column ("Post-LSA") provides, similar to FIG. 7, TEM images of the fins 12 shown in the second column of FIG. 8 following LSA to re-crystallize the fins 12. During LSA, thermal energy for annealing is provided by applying laser light to the surface of the wafer for very short time intervals, typically from several nanoseconds to several milliseconds. Heat energy from the laser light raises the temperature of the wafer surface to very high temperatures for annealing. For example, some LSA processes raise the temperature of the wafer surface to in excess of 1000° C.

While the inventive examples shown in the embodiment of FIG. 8 use LSA, other embodiments of the inventive methods may include other recrystallization techniques to re-crystallize, e.g., amorphous portions of the fins following implant. In some embodiments, recrystallization may proceed by solid phase epitaxy (SPE) utilizing, e.g., temperatures of 700° C. to 1400° C. In other embodiments, flash lamp annealing (FLA) or rapid thermal annealing (RTA) may be used.

As in the example shown in FIG. 8, according to some embodiments of the inventive methods, the pre-implant silicon nitride layer is disposed over the EG oxide layer on the fin 12.

In some embodiments of the invention, the EG oxide layer is not removed prior to formation of the silicon nitride layer and the one or more ion implantation steps.

Figure 9:
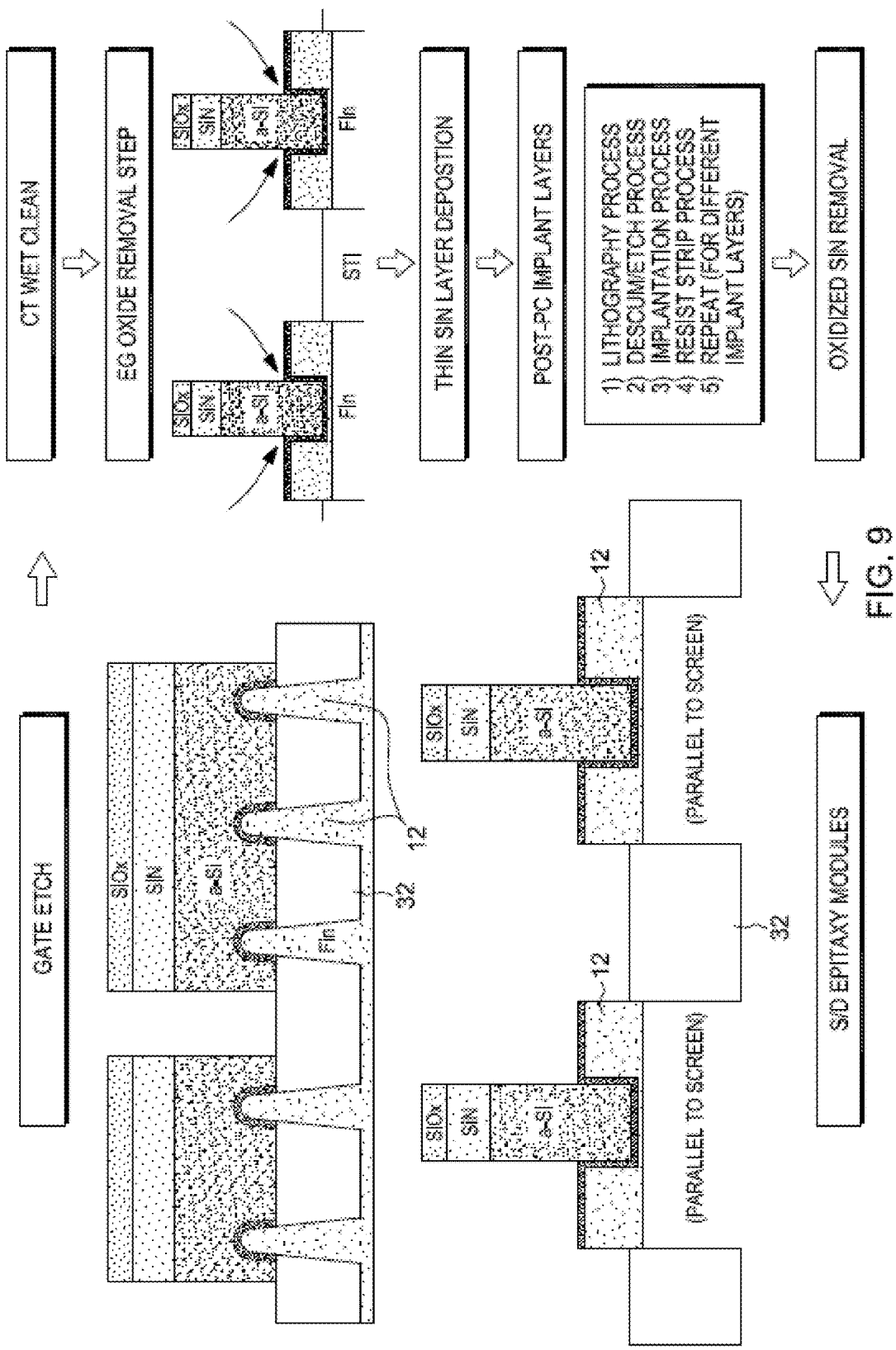
FIG. 9 depicts a process for forming a semiconductor structure according to an embodiment of the present invention.

In other embodiments of the invention, the EG oxide is removed from portions of the fin before the silicon nitride layer is formed. FIG. 9 depicts one such embodiment.

FIG. 9 depicts a process for forming a semiconductor structure according to an embodiment of the present invention. As can be seen by comparing FIG. 9 to FIG. 3B, which depicts a conventional process, the embodiment of FIG. 9 includes, prior to implantation, an EG oxide removal step, which removes EG oxide from portions of the fin 12 that are not under the gate stack. As shown, in this embodiment, the silicon nitride layer is still formed ("Thin SiN Layer Deposition" step in FIG. 9) prior to implant, such that it effectively replaces the EG oxide layer on portions of the fins not located under the gate stack.

Embodiments of the invention such as that depicted in FIG. 9 also advantageously allow for the omission of the gate reoxidation step shown in the conventional processing of FIG. 3B. Thus, in some embodiments of the invention, a gate reoxidation step is absent between gate etch processing and ion implantation.

Returning to FIG. 9, the depicted embodiment includes, following the one or more ion implantation steps ("Post-PC Implant Layers" in FIG. 9), removal of the pre-implant silicon nitride layer ("Oxidized SiN Removal" in FIG. 9). Removal of the silicon nitride layer is discussed above, and can include, for example, wet and/or dry etching to remove oxidized portions of the layer, as well as treatment (e.g., with phosphoric acid) to remove un-oxidized portions of the layer. Following removal of the silicon nitride layer, any desired further processing steps may be pursued. For example, conventional processing may be resumed.

In some embodiments of the invention, the silicon nitride layer is formed on, in addition to portions of the fin(s), at least a portion of the gate stack. This process is included (but not shown) in the "Thin SiN Layer Deposition" process step of FIG. 9.

Figure 10A:
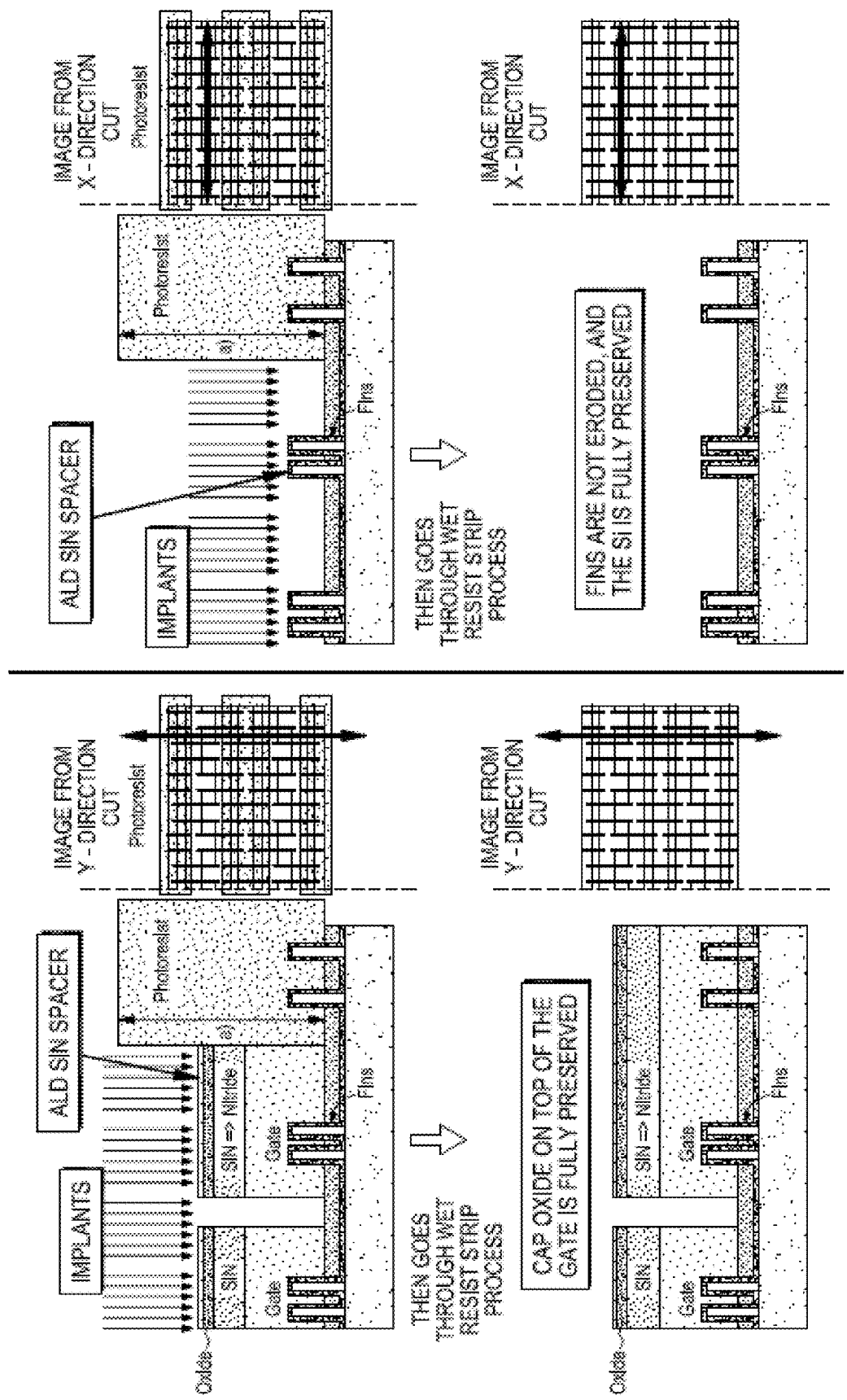
FIG. 10A depicts a scheme for forming the silicon nitride layer according to an embodiment of the invention.

FIG. 10A depicts a scheme for forming the silicon nitride layer according to an embodiment of the invention. The scheme of FIG. 10A corresponds to the "SiN Layer Deposition" process step of FIG. 9.

Figure 10B:
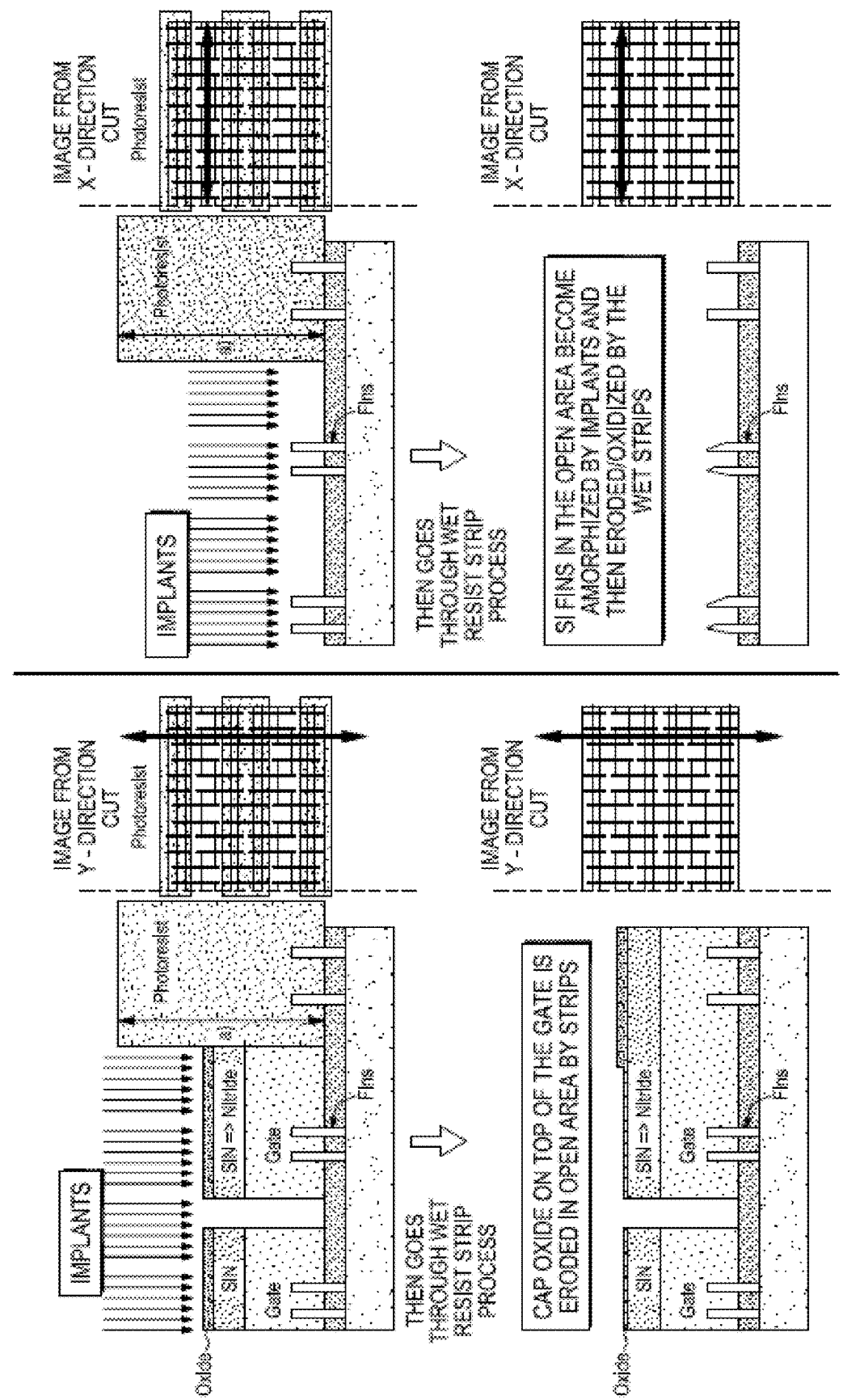
FIG. 10B depicts a scheme which represents a conventional semiconductor fabrication process lacking use of a pre-implant silicon nitride protective layer.

Returning to FIG. 10A, the depicted scheme is a blanket deposition of ALD silicon nitride done before the post-PC block implant layers to cover the cap oxide as well as the exposed fins. This protects the cap oxide from the wet resist strips, as well as the fins that become amorphized after the implantation. FIG. 10A may be compared with FIG. 10B, which depicts a scheme which represents a conventional process lacking use of a pre-implant silicon nitride protective layer. As shown in FIG. 10 B, in conventional processing, wet resist strips in the post-PC block implant layers erode the oxide on top of the gates, as well as the amorphized Si fins. Embodiments of the present invention avoid such drawbacks associated with conventional processing.

Figure 11:
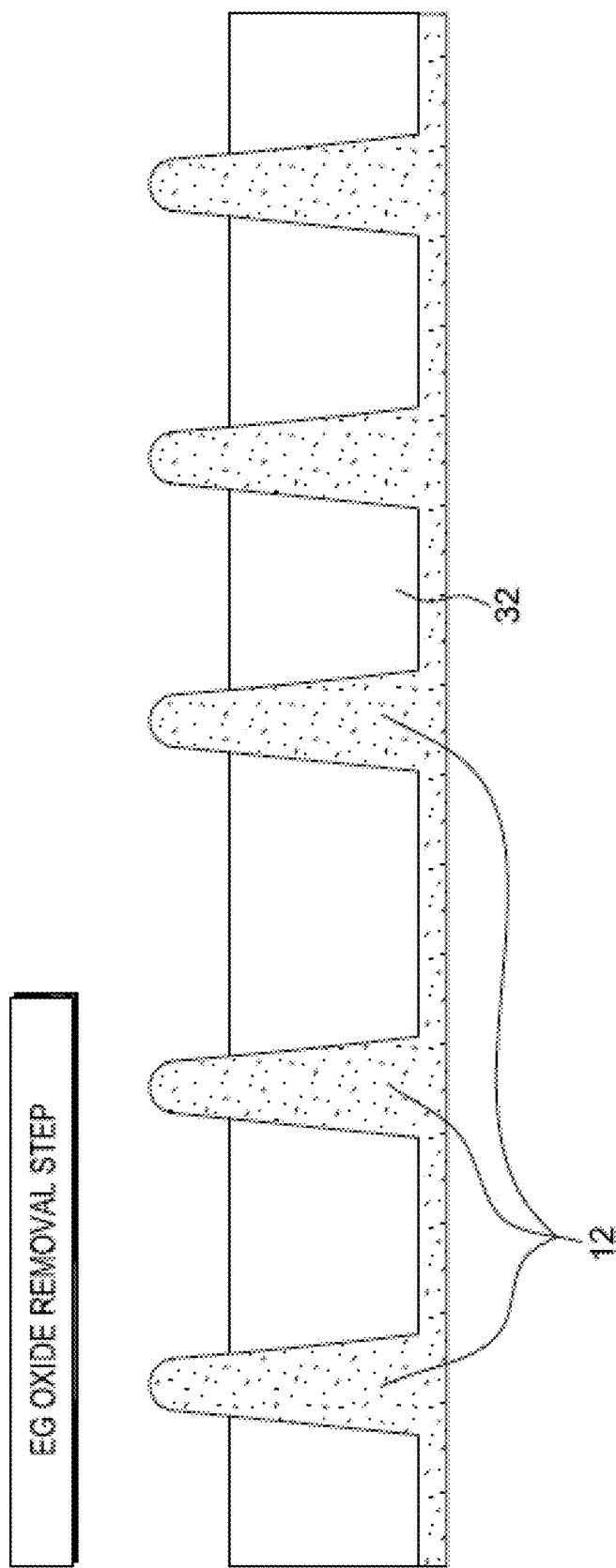
FIG. 11 shows a representation of an intermediate semiconductor structure during processing according to embodiments of the inventive method following an EG oxide removal step.

FIG. 11 shows a representation of the intermediate semiconductor structure during processing according to embodiments of the inventive method following the "EG oxide removal step" in FIG. 9. As illustrated, the EG oxide is fully removed from the fins 12 in the open area (not under PC). This is the optimal condition for implantation because it allows for the use of a lower energy implant scheme, which enhances subsequent recrystallization processing.

Figure 12:
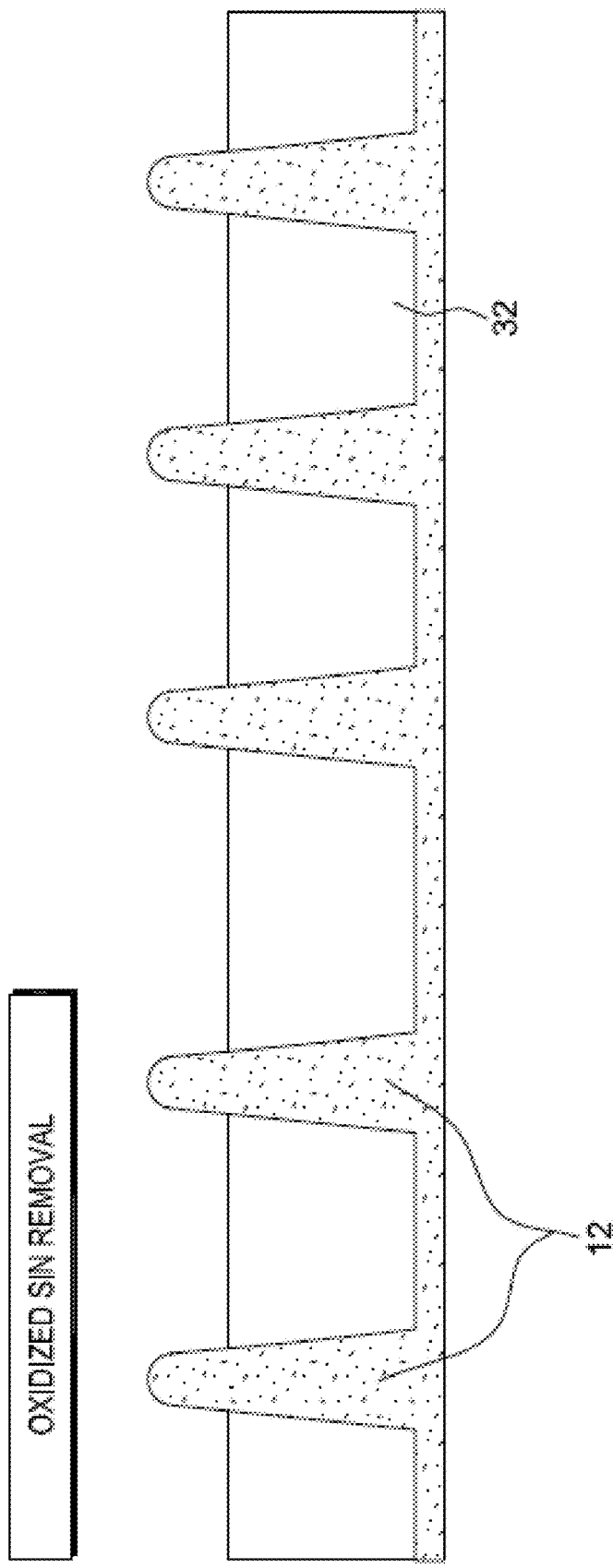
FIG. 12 shows a representation of an intermediate semiconductor structure during processing according to embodiments of the inventive method following removal of the pre-implant silicon nitride layer.

FIG. 12 shows a representation of the intermediate semiconductor structure during processing according to embodiments of the inventive method following the "Oxidized SiN Removal" step in FIG. 9. As shown, the oxidized silicon nitride layer is fully removed from the fins 12 in the open area (not under PC). If necessary, steps to remove any un-oxidized portions of the nitride layer may be taken as well. Complete removal of the layer, as shown, is the optimal condition for entrance into the S/D module and RMG module because it prevents PC blowout.

Removal of the non-conformal EG oxide and replacement with a conformal silicon nitride layer in accordance with certain embodiments of the invention advantageously improves the post-PC implantation scheme, allowing more uniform doping of the fins. The silicon nitride layer also helps to protect the gate HM oxide and lateral fin CD from the wet resist strips, hence decreasing the series resistance. Removal of this oxidized silicon nitride layer helps to prevent PC blowout in the downstream RMG module.

In certain embodiments, the invention provides a method of protecting active fins and hardmask (HM) oxide on top of a gate from resist strips seen in, e.g., post-PC block layers, which method includes removal of EG oxide after the CT layer and replacing the EG oxide with a pre-implant silicon nitride conformal layer.

In certain embodiments, the inventive processes provide for more uniform doping of fins because of the conformal layer on top of the fins, as opposed to the non-conformal EG oxide that has been conventionally used. Resultant decreases in series resistance by maintaining the lateral fin CD are also achieved.

In another aspect, the invention provides a method of forming a semiconductor structure, which method includes:
  providing an intermediate semiconductor structure, which includes:
    a semiconductor substrate;
    a fin having an EG oxide layer in contact with at least a portion of the fin; and
    a gate material disposed over the fin;
  forming, over the fin and gate material of the intermediate semiconductor structure, a gate stack hardmask including an oxide layer;
  forming a silicon nitride barrier layer on the oxide layer of the gate stack hardmask;
  performing one or more gate stack hardmask patterning steps;
  removing the EG oxide layer from portions of the fin that are not located under the gate; and
  subsequent to removing the EG oxide layer from portions of the fin that are not located under the gate, performing one or more ion implantation steps.

Figure 13:
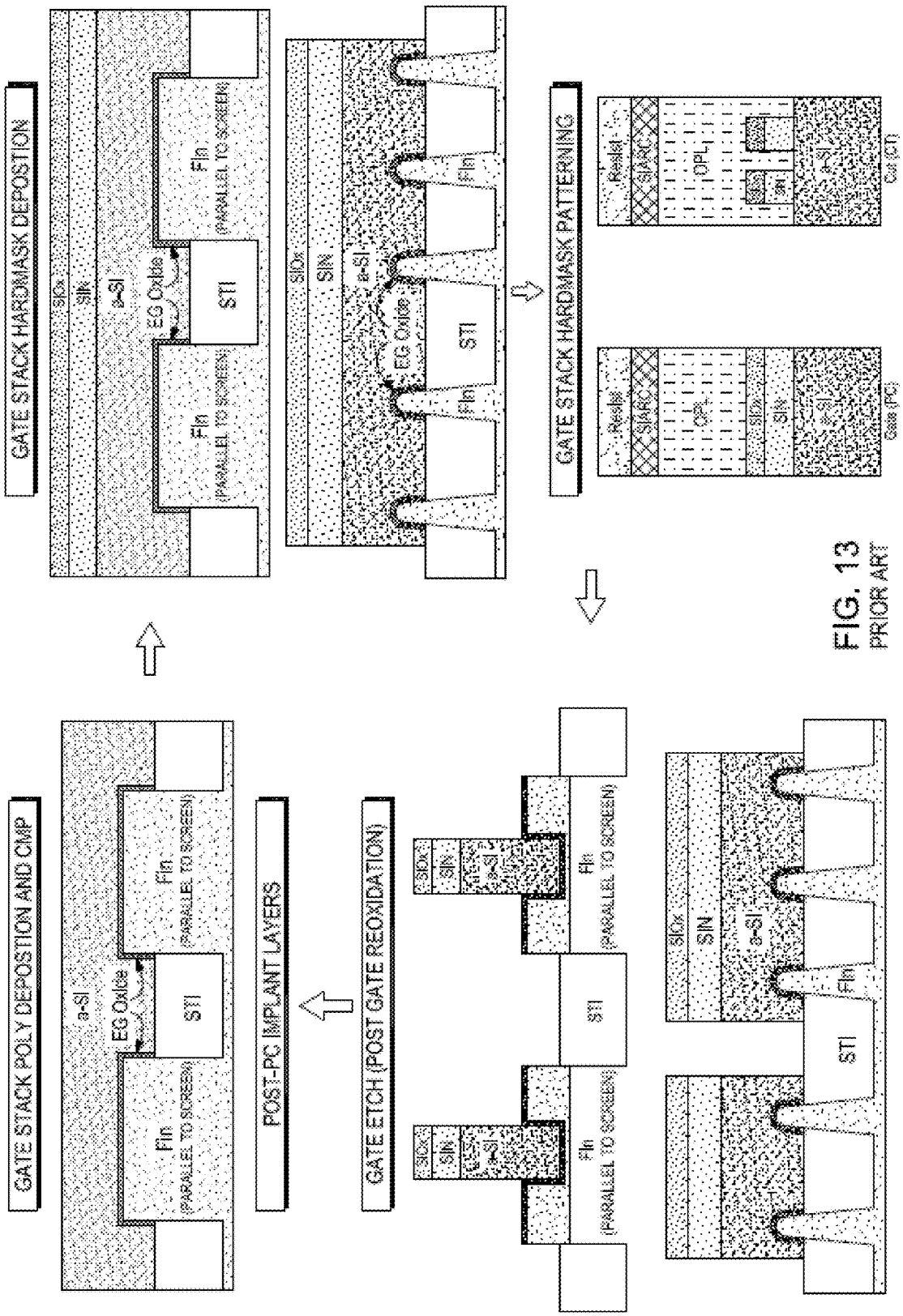
FIG. 13 depicts process steps that make up part of a conventional method of forming a semiconductor structure.

FIG. 13 depicts process steps that make up part of a conventional method of forming a semiconductor structure. As depicted, the conventional process includes, after gate patterning, one or more gate etch steps. These include, for example, prior to the post-PC implant layers, a step of depositing about a 1 nm thick oxide coating over the intermediate semiconductor structure in order to redeposit oxide that is lost during hard mask patterning.

Figure 14:
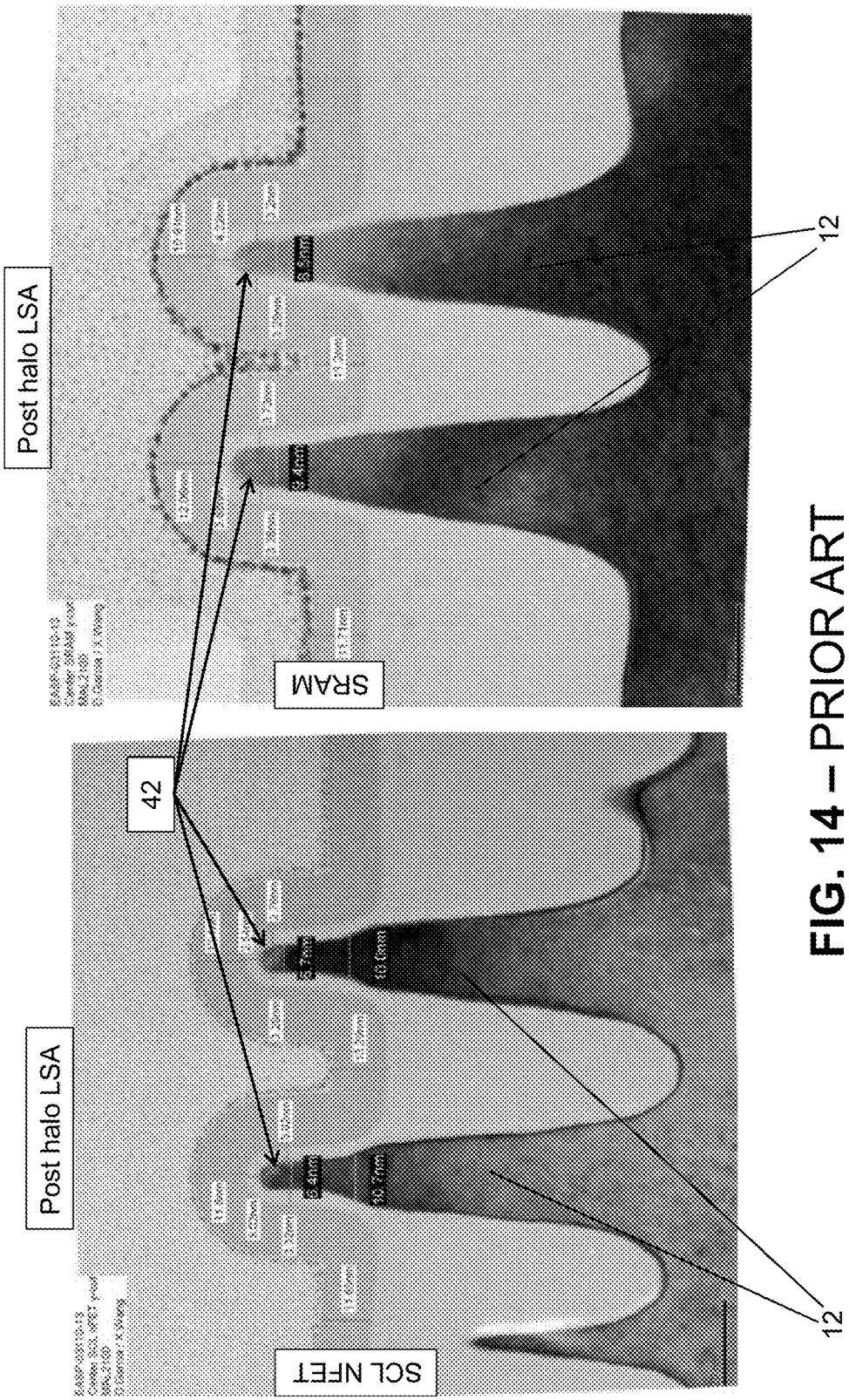
FIG. 14 depicts TEM images of fins made according to conventional semiconductor processing.

FIG. 14 depicts TEM images of fins 12 made according to conventional semiconductor processing, such as that shown in FIG. 13. The images are enlarged versions of the two TEM images shown in the "Post-LSA" column of FIG. 7. Returning to FIG. 14, as can be seen, the fins 12, which were prepared using conventional processing (including implanting through the EG oxide on the fins), underwent considerable amorphization, making it difficult to recrystallize the silicon fins effectively, and causing defectivity in the form of fin defects after recrystallization 42 (see FIG. 7 as well).

Figure 15:
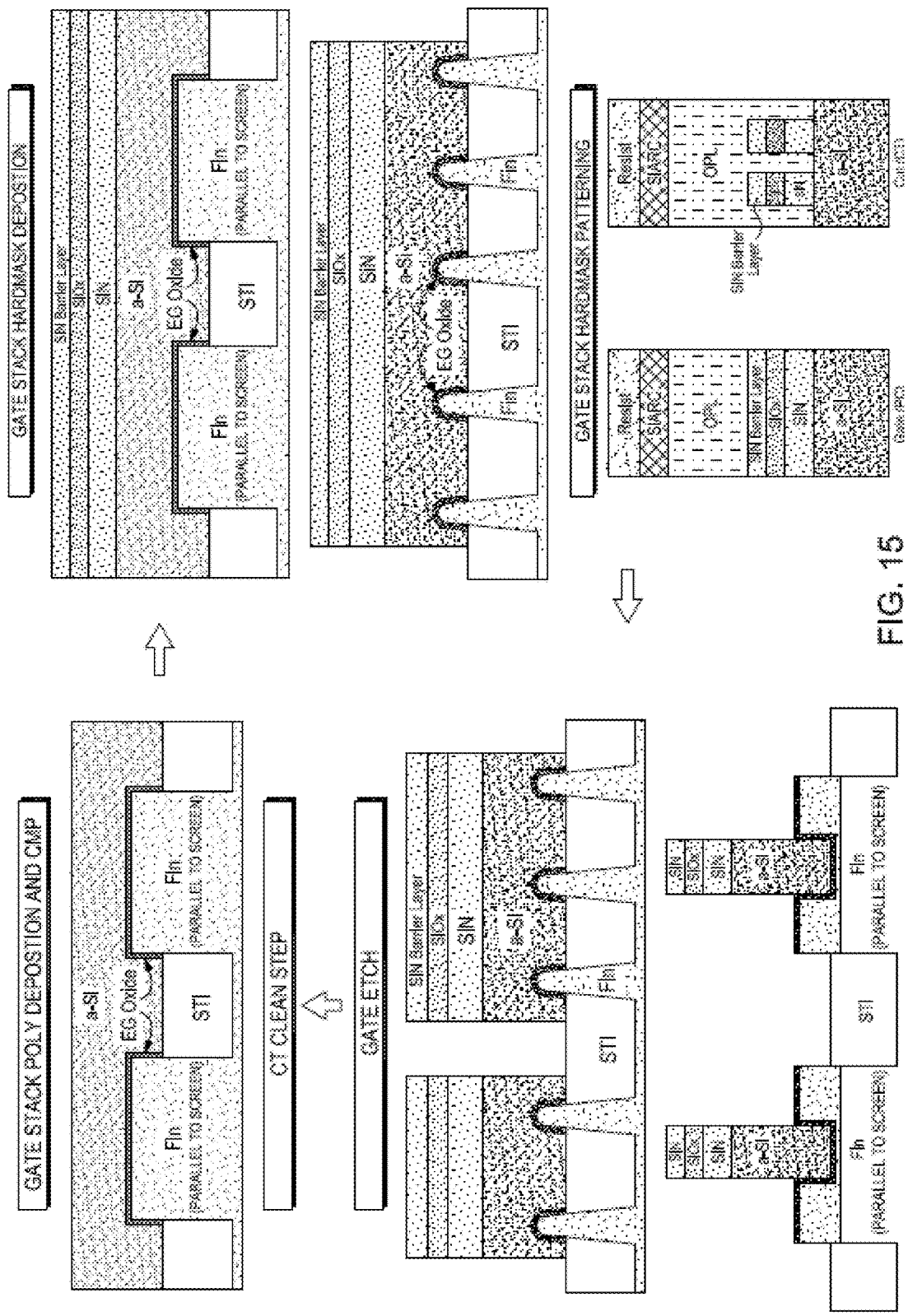
FIG. 15 depicts process steps according to an embodiment of the present invention, utilizing a silicon nitride barrier layer, which is deposited over an oxide layer of the gate stack.

FIG. 15 depicts process steps according to an embodiment of the present invention, utilizing a silicon nitride barrier layer ("SiN Barrier Layer"), which is deposited over an oxide layer ("SiOx" in FIG. 15) of the gate stack. The silicon nitride barrier layer is deposited during gate stack hardmask deposition, and it remains on the gate stack following hardmask patterning. The silicon nitride barrier layer serves to protect the oxide layer ("SiOx" in FIG. 15) over which it is formed. In the depicted process embodiment, the protective silicon nitride barrier layer protects the underlying oxide layer of the gate stack sufficiently such that, following the gate etch, the re-oxidation step shown in FIG. 13 may be skipped.

In the depicted embodiment, following the gate etch, a "CT Clean Step" is performed to remove excess oxide (EG oxide) from the fins. The clean step may be, e.g., a wet or dry etch, such as HF or Siconi treatment, for removing the EG oxide layer from portions of the fin that are not located under the gate stack. By forming the silicon nitride barrier layer prior to removing the EG oxide layer from free portions of the fin (i.e., not the portions under the gate stack), the oxide layer in the gate is protected during the later step that removes the EG oxide. By removing the EG oxide layer from around the free portions of the fins, but not from under the gate stack, and by protecting the oxide layer in the gate ("SiOx" in FIG. 15), embodiments of the invention all for use of lower implant energies, thereby avoiding fin defects that occur after recrystallization in conventional semiconductor processing schemes.

Figure 16:
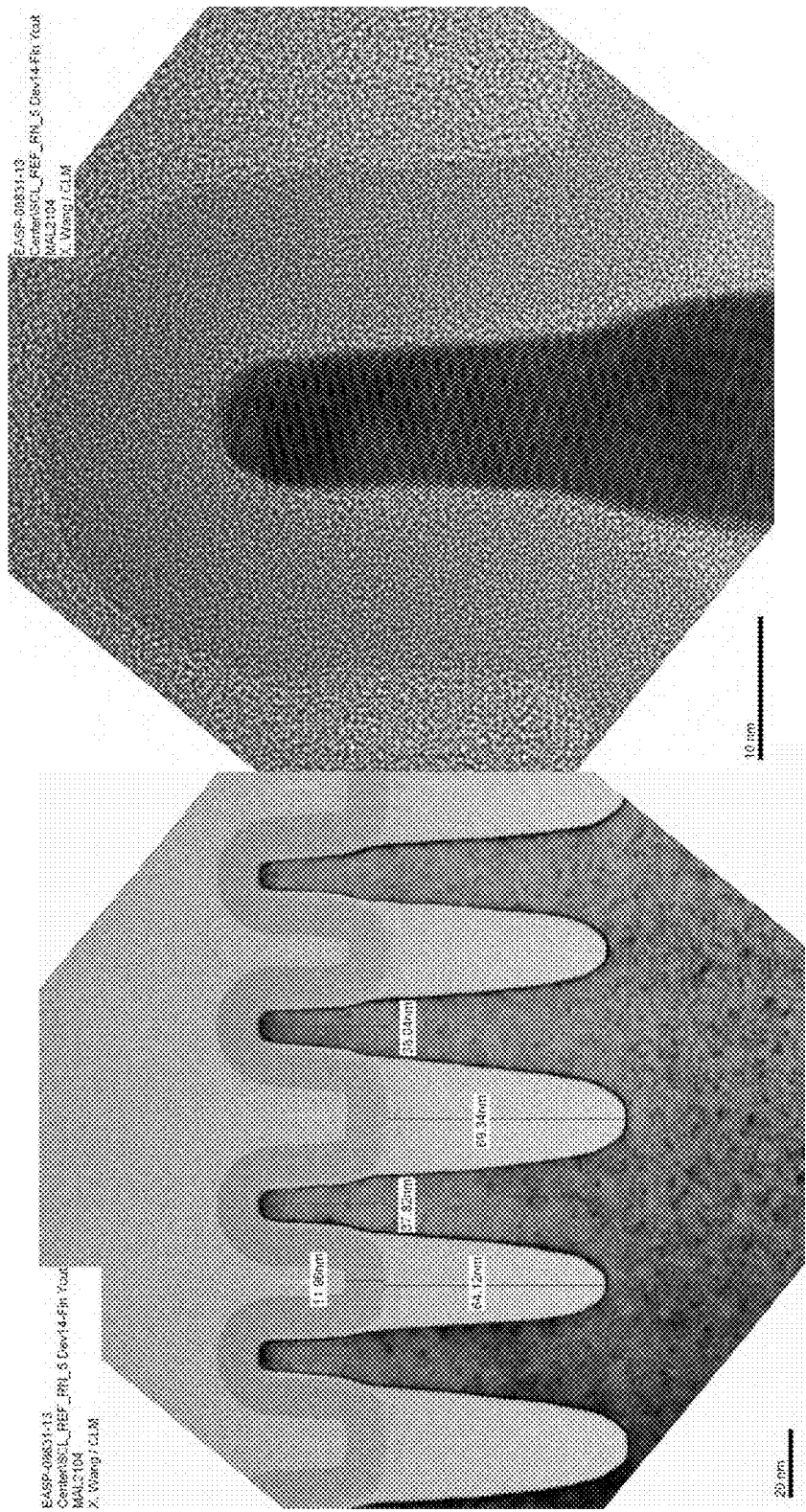
FIG. 16 depicts TEM images showing fin semiconductor structures during processing according to an embodiment of the present invention.

FIG. 16 depicts TEM images showing fin semiconductor structures during processing according to an embodiment of the present invention, resulting from the process shown in FIG. 15 (including removal of EG oxide), and following ion implantation (1 keV implant, which is ⅕ of the implant energy used for the fins shown in FIG. 14). Fin CD is completely retained, and no fin stacking faults are detected, due to use of ⅕ of the implant energy of conventional processing.

FIG. 17 shows a representation of the intermediate semiconductor structure during processing according to embodiments of the inventive method following the "CT Clean Step" in FIG. 15. As shown, the EG oxide is fully removed from the fins 12 in the open area (not under PC). This is the optimal condition for implantation because it allows for the use of a lower energy implant scheme, which enhances the recrystallization process.

According to various embodiments of the invention, after the CT Clean Step, the method includes performing post-PC block layers (implantation layers), e.g., one or more ion implantation steps.

By making it possible to use a lower energy implantation scheme, for example less than or equal to ⅕ the energy of conventional processing, embodiments of the inventive method reduce the amount of fin defectivity present after fins are recrystallized, thereby improving device performance by, e.g., reducing resistance and increasing the drive current. Further, use of the nitride barrier layer prevents the gate hard mask oxide from being affected when removing the EG oxide.

In various embodiments, the invention includes semiconductor structures made according to the presently-disclosed methods of making semiconductor structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

Where one or more ranges are referred to throughout this specification, each range is intended to be a shorthand format for presenting information, where the range is understood to encompass each discrete point within the range as if the same were fully set forth herein.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A method of forming a semiconductor structure comprising:
    providing an intermediate semiconductor structure, comprising:
        a semiconductor substrate;
        a fin having an extended gate (EG) oxide layer in contact with at least a portion of the fin; and
        a gate material disposed over the fin;
    forming, over the fin and gate material of the intermediate semiconductor structure, a gate stack hardmask comprising an oxide layer;
    forming, prior to gate etch processing to define gate regions, a silicon nitride barrier layer on the oxide layer of the gate stack hardmask;
    performing one or more gate stack hardmask patterning steps, comprising forming, directly on the silicon nitride barrier layer, an organic planarizing layer (OPL);
    removing the EG oxide layer from portions of the fin that are not located under the gate; and
    subsequent to removing the EG oxide layer from portions of the fin that are not located under the gate, performing one or more ion implantation steps.

2. The method according to claim 1, wherein removing the EG oxide layer comprises use of hydrofluoric acid and/or Siconi treatment.

3. The method according to claim 1, comprising forming the silicon nitride barrier layer on portions of the oxide layer of the gate stack hardmask that are formed on one or more fins that, following gate etch processing, are not located under the gate.

* * * * *